US009766299B2

(12) United States Patent
Collins et al.

(10) Patent No.: US 9,766,299 B2
(45) Date of Patent: Sep. 19, 2017

(54) METHOD FOR ELECTRONICALLY TESTING INTEGRITY OF IDEAL DIODE COMPONENTS USED IN OR'D VOLTAGE BUS

(71) Applicant: HAMILTON SUNDSTRAND CORPORATION, Charlotte, NC (US)

(72) Inventors: Mark J. Collins, Windsor Locks, CT (US); Ronald Daley, The Villages, FL (US); Steven A. Avritch, Bristol, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 196 days.

(21) Appl. No.: 14/663,250

(22) Filed: Mar. 19, 2015

(65) Prior Publication Data
US 2016/0274195 A1    Sep. 22, 2016

(51) Int. Cl.
H02J 1/10       (2006.01)
G01R 31/40    (2014.01)
H02M 3/158   (2006.01)

(52) U.S. Cl.
CPC .......... *G01R 31/40* (2013.01); *H02M 3/158* (2013.01)

(58) Field of Classification Search
CPC .............................. H02M 3/158; G01R 31/40
USPC .......................................................... 307/52
See application file for complete search history.

(56) References Cited

U.S. PATENT DOCUMENTS

| 4,394,647 A | 7/1983 | Van | |
|---|---|---|---|
| 7,952,488 B1* | 5/2011 | Zansky | G01R 31/40 320/136 |
| 2004/0042145 A1* | 3/2004 | Garnett | G01R 31/40 361/115 |
| 2007/0018502 A1* | 1/2007 | Bazinet | H02M 1/10 307/80 |
| 2007/0108991 A1 | 5/2007 | Ball | |
| 2013/0181729 A1* | 7/2013 | Egan | G01R 31/40 324/750.01 |

OTHER PUBLICATIONS

Extended European Search Report dated Sep. 19, 2016 in European Application No. 16161168.6.
"LTC4351 MOSFET Diode-OR Controller Data Sheet," Linear Technology, Jan. 1, 2003, retrieved from <http://cds.linear.com/docs/en/datasheet/4351fd.pdf> on Jul. 28, 2015, 20 pages.

* cited by examiner

*Primary Examiner* — Jared Fureman
*Assistant Examiner* — Duc M Pham
(74) *Attorney, Agent, or Firm* — Snell & Wilmer L.L.P.

(57) ABSTRACT

A power system includes a first power input, a second power input, a power output, a first ideal diode coupled to the a power input and a power output and a second ideal diode coupled to a second power input and the power output. The power system also includes a first switching circuit coupled to the first power input and the first ideal diode and a second switching circuit coupled to the second power input and the second ideal diode, the switching circuits operating as an open or a short circuit based on an input. The power system also includes a test controller coupled to the first switching circuit, the second switching circuit and the power output and configured to determine an operating status of the power system based on an input to the first switch, inputs to the second switch and the power output.

12 Claims, 3 Drawing Sheets

METHOD FOR ELECTRONICALLY TESTING INTEGRITY OF IDEAL DIODE COMPONENTS USED IN OR'D VOLTAGE BUS

FIELD

The present disclosure relates to a system and method for testing ideal diodes, and more particularly to a system and method for testing ideal diodes used together as an OR gate in a redundant voltage bus.

BACKGROUND

Some redundant power supplies and other power conversion elements use standard diodes (i.e., non-ideal diodes such as Schottky diodes) to OR together two input voltage sources for providing a redundant output voltage. Standard diodes typically have a turn-on voltage (i.e., a voltage drop across the diode) of approximately 1 volt which causes power to dissipate as heat. To reduce power loss, some power supplies and power conversion elements standard diodes use ideal diodes (i.e., a controller controlling a field effect transistor (FET) transistor to function as a diode) in place of standard diodes as they dissipate less power. These power supplies and power conversion elements may power sensitive and/or important electronics, such as components on an aircraft. Accordingly, it is desirable to be able to test the operation of the ideal diodes to ensure that they are functioning properly and that there are no undetectable component failures.

SUMMARY

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

What is described is a power system. The power system includes a first power input configured to transmit a first voltage signal and a second power input configured to transmit a second voltage signal. The power system also includes a power output, a first ideal diode coupled to the first power input and the power output and a second ideal diode coupled to the second power input and the power output. The power system also includes a first switching circuit coupled to the first power input and the first ideal diode and configured to switch between a first switch open state that prevents the first voltage signal from being received at the first ideal diode and a first switch closed state based on a first switch input. The power system also includes a second switching circuit coupled to the second power input and the second ideal diode and configured to switch between a second switch open state that prevents the second voltage signal from being received at the second ideal diode and a second switch closed state based on a second switch input. The power system also includes a test controller coupled to the first switching circuit, the second switching circuit and the power output and configured to determine an operating status of the power system based on the first switch input, the second switch input and the power output.

Also described is a method for determining an operating status of a power system having a first ideal diode coupled to a first power input and a power output and a second ideal diode coupled to a second power input and the power output. The method includes controlling, by a test controller, a first switch input of a first switching circuit positioned between the first power input and the first ideal diode and configured to switch between a first switch open state that prevents the first voltage signal from being received at the first ideal diode and a first switch closed state based on the first switch input. The method also includes controlling by the test controller, a second switch input of a second switching circuit positioned between the second power input and the second ideal diode and configured to switch between a second switch open state that prevents the first voltage signal from being received at the second ideal diode and a second switch closed state based on the second switch input. The method also includes determining, by the test controller, the operating status of the power system based on the first switch input, the second switch input and the power output.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
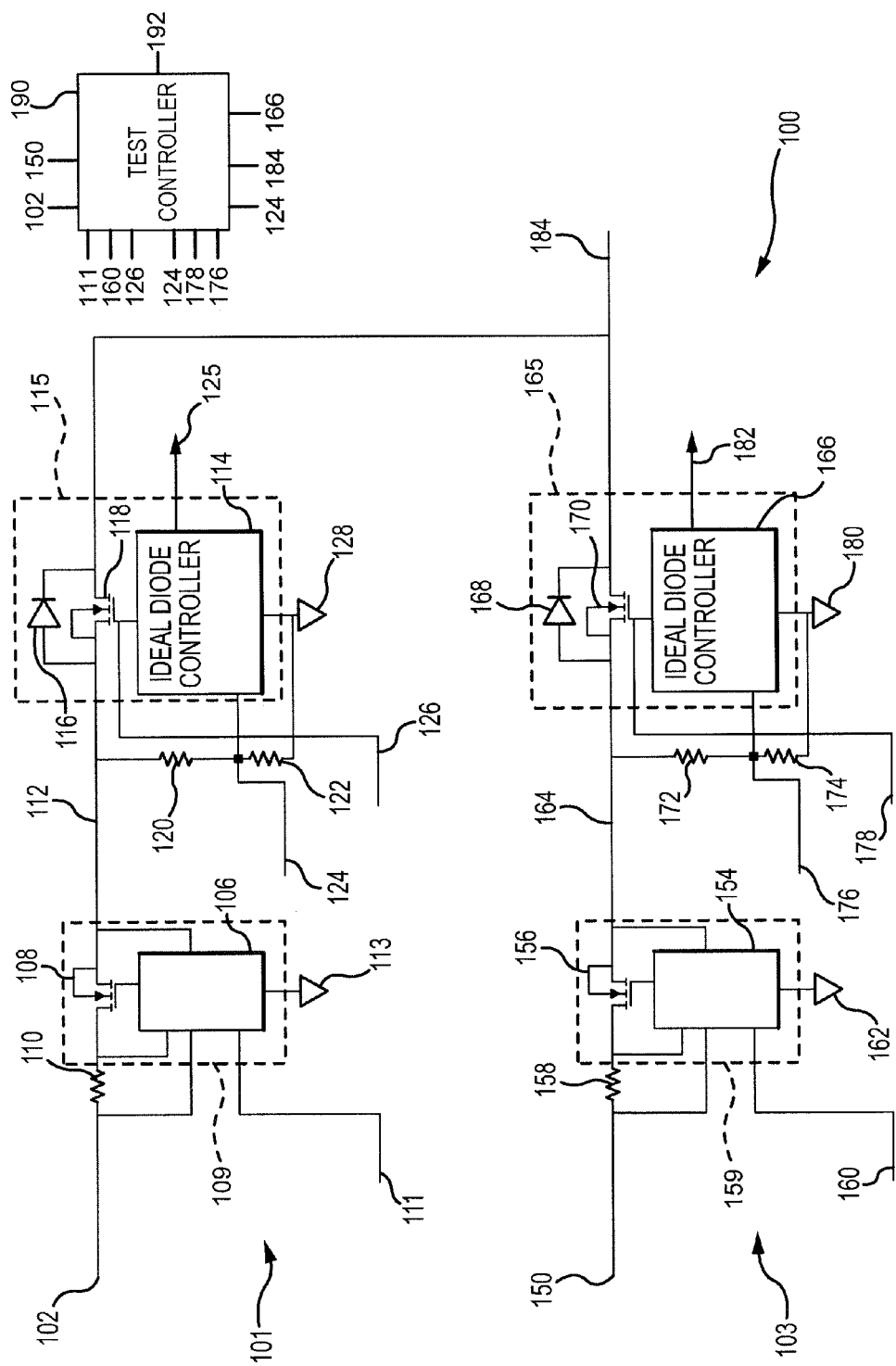
FIG. 1 illustrates a power system having two inputs OR'd together using ideal diodes and one output resulting from the OR'ing of the two inputs, in accordance with various embodiments.

With reference now to FIG. 1, a power system 100 includes a first sub-circuit 101 having a first power input 102 and a first ideal diode 115 and a second sub-circuit 103 having a second power input 150 and a second ideal diode 165. The output of the first sub-circuit 101 and the output of the second sub-circuit 103 are electrically connected at the power output 184. In response to power being supplied at both first power input 102 and second power input 150, power output 184 will be similar to the larger of the output of first ideal diode 115 and second ideal diode 165 (i.e., plus or minus 10% of the larger output). In response to power being supplied at either first power input 102 or second power input 150, power output 184 will be equal to the power supplied by the portion of the circuit receiving power at the input. In response to no power being supplied at first power input 102 and second power input 150, no power will be supplied to the power output 184. In other words, the output of first ideal diode 115 is OR'd with the output of second ideal diode 165 such that first ideal diode 115 and second ideal diode 165 functionally operate as an OR gate. This function is achieved because the ideal diode (i.e., the controller) that outputs the lower voltage of the two ideal diodes will be reverse biased based on power output 184 voltage being higher than the voltage on the input side of the ideal diode. This causes the ideal diode with the lower output voltage to be "turned off."

Power system 100 may be used for providing power to devices. The output of power system 100 may be received by a sensitive and/or important component, such as an electrical component on an aircraft. Accordingly, it is desirable to be able to determine the operating status of the ideal diodes (i.e., determining faults in the controllers, the FET transistors, the connectors or the like).

Power system 100 includes features for determining the operating status of the ideal diodes such as a switching circuit 109 that includes a metal-oxide semiconductor field-effect transistor (MOSFET) 108 that operates as a switch and a first switch controller 106 that controls MOSFET 108. In various embodiments, switching circuit 109 may be a voltage current surge protector or other element or combination of elements capable of receiving an input and changing between an open circuit element and a closed circuit element based on the input. As illustrated in FIG. 1, MOSFET 108 is an N-channel MOSFET. In various embodiments, MOSFET 108 may be a P-channel MOSFET or a different type of transistor.

First switch controller 106 may be a surge protector controller such as an LT4356-1, available from Linear Technology of Milpitas, California. In various embodiments, first switch controller 106 may be any other type of controller capable of controlling MOSFET 108. In various embodiments, first switch controller 106 may be implemented using one or more of a field-programmable gate array (FPGA), a central processing unit (CPU) or the like.

A resistor 110 is positioned between two terminals of first switch controller 106 and operates as a sensor for detecting voltage at first power input 102 such that first switch controller 106 can control MOSFET 108 based on a detected voltage across resistor 110. An input 111 is coupled to first switch controller 106 such that MOSFET 108 may also be controlled by first switch controller 106 based on a signal at input 111. Input 111 may be controllable by a user such that the user can turn MOSFET 108 on or off. In various embodiments, a low voltage at input 111 turns MOSFET 108 off such that minimal current flows through MOSFET 108. When the voltage at input 111 returns high, current may again flow through MOSFET 108. First switch controller 106 may also be coupled to a ground 113.

Any voltage present at a terminal 112 is received by first ideal diode 115. First ideal diode 115 includes a first diode controller 114 and a first diode MOSFET 118. In various embodiments, first diode MOSFET 118 may be a P-channel MOSFET, but may also be an n-channel MOSFET or other type of transistor. First diode MOSFET 118 may include a body diode 116 that is an inherent property of first diode MOSFET 118. Body diode 116 has a lower turn-on voltage than standard diodes such that lower power will dissipate from body diode 116 relative to standard diodes. Body diode 116 initially allows current to flow to the load before lower power loss first diode MOSFET 118 is turned on by ideal diode controller 114.

First diode controller 114 may be coupled to a gate of first diode MOSFET 118 and control first diode MOSFET 118 between a conducting configuration and a non-conducting configuration. A second resistor 120 and a third resistor 122 may be coupled in series between terminal 112 and a ground 128. Second resistor 120 and third resistor 122 may function as a voltage divider. A first diode input 124 is connected between second resistor 120 and third resistor 122 and coupled to first diode controller 114 such that operation of first diode controller 114 is based on voltage at first diode input 124. The voltage at first diode input 124 may be controlled by a user and/or may be based on voltage at terminal 112, which may be useful for determining the status of first diode controller 114 and/or first diode MOSFET 118. A first MOSFET input 126 may be coupled to the gate of first diode MOSFET 118 for controlling operation (i.e., turning "on" or "off") of first diode MOSFET 118.

A first fault signal 125 is output from first diode controller 114 and may include data indicating the operating status of first ideal diode 115 based on signals provided at input 111, first MOSFET input 126 and first diode input 124. In particular, first fault signal 125 measures voltage drop across first diode MOSFET 118. When first diode MOSFET 118 is closed, it will have a small voltage (in some embodiments, less than 0.5V) across it. However, if first diode MOSFET 118 is open, voltage across first body diode 116 of diode MOSFET 118 will be larger than the turn-on voltage of diode MOSFET 118. First fault signal 125 may turn low in response to the voltage across body diode 116 of first diode MOSFET 118 being greater than a predetermined amount, indicating that the drain-to-source channel of diode MOSFET 118 is not conducting properly.

First diode controller 114 may be implemented using one or more of an FPGA, CPU or the like. In various embodiments, first diode controller 114 may be a positive high voltage ideal diode having an operating range between 9V and 80V, such as an LTC4355, available from Linear Technology of Milpitas, Calif.

Second sub-circuit 103 includes similar components and operates in a similar manner as first sub-circuit 101. Second power input 150 is provided to a second switching circuit 159 via a resistor 158. Second switching circuit 159 includes a second switch controller 154 similar to first switch controller 106 and a MOSFET 156 similar to MOSFET 108. An input 160 is provided to second switching circuit 159 via a sensing resistor 158. Output of switching circuit 159 is received at terminal 164 and second ideal diode 165. Second ideal diode 165 includes a second diode MOSFET 170 having a body diode 168 similar to first diode MOSFET 118 having body diode 116 and a second diode controller 166 similar to first diode controller 114. Voltage dividing resistor 172 and 174 are positioned between terminal 164 and a ground 180. A second diode input 176 is used as an input to control second diode controller 166 and thus second diode MOSFET 170. Another second MOSFET input 178 is coupled to a gate of second diode MOSFET 170 for controlling the operation of second diode MOSFET 170. A second fault signal 182 provides similar data as first fault signal 125.

A test controller 190 may be coupled to the inputs and outputs of power system 100 and generate a status signal 192 indicating the operating status of power system 100 based on the combinations of input and output signals. Test controller 190 may be implemented using an FPGA, a CPU or any other type of controller or processor. Test controller 190 may be coupled to input 111, input 160, first MOSFET input 126, first diode input 124, second MOSFET input 178 and second diode input 176 and provide signals to the inputs. Test controller 190 may also receive data from first power input 102, second power input 150, first fault signal 125, second fault signal 182 and power output 184.

Figure 2A:
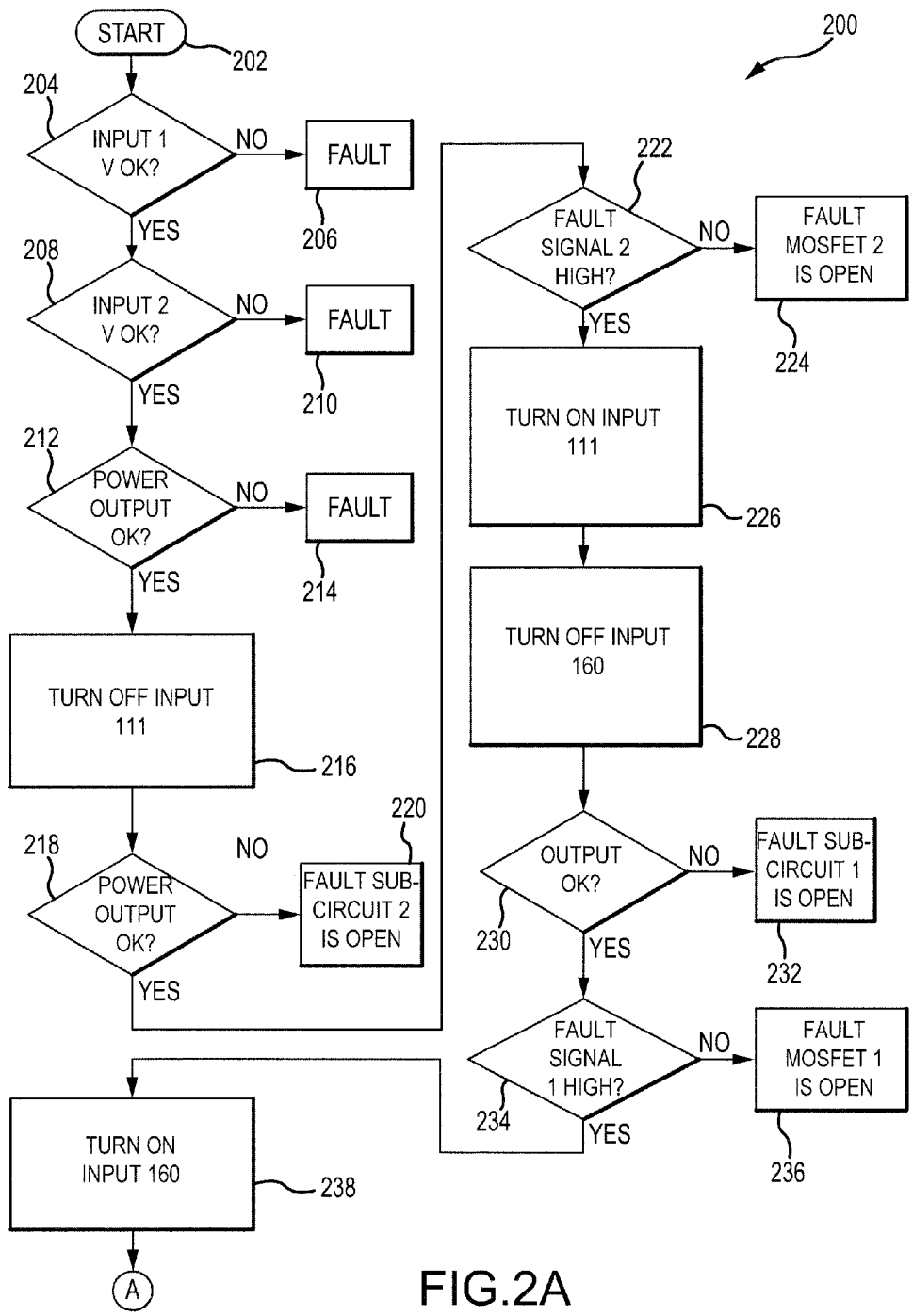
FIGS. 2A and 2B illustrate an exemplary method for testing an operating status of a power system including two ideal diodes for OR'ing two inputs, in accordance with various embodiments.
Figure 2B:
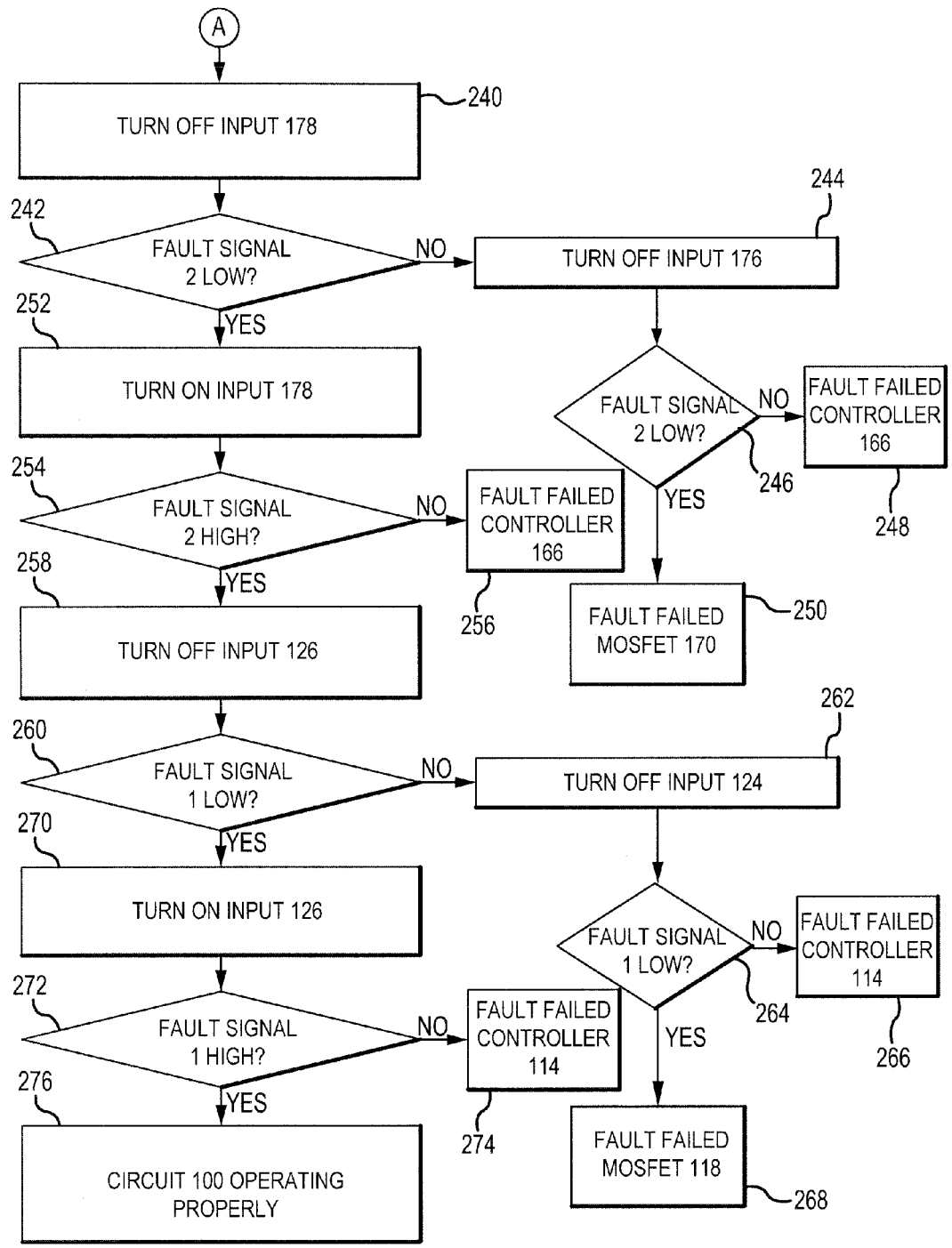

With reference now to FIGS. 2A and 2B, a method 200 beginning at block 202 may be used for determining an operating status of first ideal diode 115 and second ideal diode 165. The blocks or steps of method 200 are illustrated in a particular order but the scope of the present disclosure is not limited to the order illustrated in FIGS. 2A and 2B. Method 200 may be performed by test controller 190.

With reference now to FIGS. 1 and 2A, in block 204, voltage is measured at first power input 102. If the voltage measured at first power input 102 is within a predetermined range of the voltage supplied to power input 102, method 200 proceeds to block 208. If the voltage measured at first power input 102 is not correct, the method proceeds top block 206 indicating a fault within first sub-circuit 101.

In block 208, voltage is measured at second power input 150. If the measured voltage is not correct, method 200 proceeds to block 210 indicating a fault within second sub-circuit 103. If the measured voltage is correct, method 200 proceeds to block 212.

In block 212, voltage is measured at power output 184 to determine whether the voltage at power output 184 is correct. If the voltage at power output 184 is incorrect, then the method 200 proceeds to block 214 indicating a fault within power system 100. If the voltage measured at power output 184 is correct, method 200 proceeds to block 216.

In block 216, a signal applied to input 111 is turned low (i.e., a binary value of input 111 is 0). This causes first switch controller 106 to switch MOSFET 108 to a non-conducting (or open) configuration such that voltage at first power input 102 does not reach first ideal diode 115. In some embodiments, switching circuit 109 may be configured such that a high signal at input 111 (i.e., a binary value of input 111 is 1) turns MOSFET 108 off.

In block 218, voltage is again measured at power output 184 to determine if it is correct. In response to the measured voltage at power output 184 not being correct, the method will proceed to block 220 indicating a fault. This fault likely indicates that a portion of second sub-circuit 103 between second power input 150 and power output 184 is open such that voltage cannot travel from second power input 150 to power output 184.

In block 222, it is determined whether second fault signal 182 is high. Second fault signal 182 measures voltage drop across second diode MOSFET 170. When second diode MOSFET 170 is closed, body diode 168 will have a small voltage across it. Accordingly, second diode MOSFET 170 will have the same voltage drop as body diode 168. However, if second diode MOSFET 170 is open, voltage across second diode MOSFET 170 will be larger than the turn on voltage of body diode 168. Second fault signal 182 turns low in response to the voltage across second diode MOSFET 170 being greater than a predetermined amount. In response to second fault signal 182 being low, method 200 proceeds to block 224 where a fault is found indicating that second diode MOSFET 170 of second ideal diode 165 is open.

In block 226, input 111 is again turned high causing MOSFET 108 to close, allowing voltage from first power input 102 to reach first ideal diode 115. In block 228, input 160 is turned low. This causes second switch controller 154 to generate a signal to the gate of MOSFET 156 causing MOSFET 156 to become open and thus preventing current from flowing through MOSFET 156.

In block 230, it is determined whether voltage at power output 184 is correct. If voltage at power output 184 is not correct the method may proceed to block 232 in which a fault is found, indicating that an open exists in first sub-circuit 101 between first power input 102 and power output 184.

In block 234, it is determined whether first fault signal 125 is high. If first fault signal 125 is high, then a fault will be found in block 236 indicating that first diode MOSFET 118 of first ideal diode 115 is open. First fault signal 125 thus operates in a similar fashion as second fault signal 182 of second sub-circuit 103 as above.

In block 238, input 160 is turned high allowing current to flow through MOSFET 156.

With reference now to FIGS. 1 and 2B, in block 240, second MOSFET input 178 is turned low. Because of the configuration of second diode MOSFET 170 and because second MOSFET input 178 is coupled to the gate of second diode MOSFET 170, this turns second diode MOSFET 170 off (i.e., causing an open between terminal 164 and power output 184).

In block 242, it is determined whether second fault signal 182 cycles low. When second diode MOSFET 170 is turned off, voltage across second diode MOSFET 170 should increase. This increase in voltage causes second fault signal 182 to cycle low if second diode controller 166 and second diode MOSFET 170 are operating properly. If second fault signal 182 does not cycle low, this indicates that second diode controller 166 may not be operating properly and/or that second diode MOSFET 170 is shorted.

In block 244, second diode input 176 is turned low. When second diode input 176 is turned low and second diode controller 166 is operating properly, second diode controller 166 should cause second fault signal 182 to cycle low. In block 246, it is determined whether second fault signal 182 cycles low. In block 248, if second fault signal 182 does not cycle low, it is determined that the fault is within second diode controller 166. In block 250, if it is determined that second fault signal 182 did cycle low, it is determined that a fault has occurred within second diode MOSFET 170. The fault indicates that second diode MOSFET 170 is shorted.

Returning to block 242, if second fault signal 182 cycles low in response to second MOSFET input 178 being turned low, this indicates that second diode MOSFET 170 is not shorted. This is because the larger voltage across second diode MOSFET 170 indicates that second diode MOSFET 170 is open and thus turns second fault signal 182 low.

In block 252, second MOSFET input 178 is turned high. This should cause second diode MOSFET 170 to return to a conducting configuration. In block 254, it is determined whether second fault signal 182 returns to a high value indicating that the voltage across second diode MOSFET 170 has returned below the predetermined value. In block 256 if second fault signal 182 did not return to the high value, it is determined that second diode controller 166 has failed.

In block 258, first MOSFET input 126 to first diode controller 114 is turned low. This should cause first diode MOSFET 118 to turn off such that it acts as an open circuit.

In block 260, it is determined whether first fault signal 125 cycles low. If first fault signal 125 cycles low then a short does not exist across first diode MOSFET 118. This is because with first diode MOSFET 118 turned off, voltage across first diode MOSFET 118 should be greater than the predetermined value at which first fault signal 125 will cycle low. If first fault signal 125 does not cycle low, this indicates that either first diode MOSFET 118 is shorted or first diode controller 114 is operating incorrectly.

If first fault signal 125 does not cycle low, then first diode input 124 is turned low.

In response, first diode controller 114 should cause first fault signal 125 to turn low. Accordingly, in block 264, it is determined whether first fault signal 125 cycles low. If first fault signal 125 does not cycle low, a fault will be found in block 266 indicating that first diode controller 114 has failed. However, if first fault signal 125 does cycle low, it is determined in block 268 that a fault has occurred in first diode MOSFET 118 causing it to be shorted.

Returning to block 270, first MOSFET input 126 is again turned high. In block 272, it is determined whether first fault signal 125 returns to a high value. If first fault signal 125 does not return to a high value, then a fault will be found in block 274 indicating that first diode controller 114 has failed.

In block 276, if first fault signal 125 does return to a high value, it will be found that power system 100 is operating correctly. This is because a return to a high value at first fault signal 125 indicates that first diode MOSFET 118 is turned on and is not open. Additionally, voltage drop across first diode MOSFET 118 allows first fault signal 125 to return to a high value.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A power system comprising:
    a first power input configured to transmit a first voltage signal;
    a second power input configured to transmit a second voltage signal;
    a power output;
    a first ideal diode coupled to the first power input and the power output;
    a second ideal diode coupled to the second power input and the power output;
    a first switching circuit coupled to the first power input and the first ideal diode and configured to switch between a first switch open state that prevents the first voltage signal from being received at the first ideal diode and a first switch closed state based on a first switch input;
    a second switching circuit coupled to the second power input and the second ideal diode and configured to switch between a second switch open state that prevents the second voltage signal from being received at the second ideal diode and a second switch closed state based on a second switch input; and
    a test controller coupled to the first switching circuit, the second switching circuit and the power output and configured to determine an operating status of the power system based on the first switch input, the second switch input and the power output,
    wherein the first ideal diode includes a first diode MOSFET coupled to a first diode controller configured to control the first diode MOSFET, and
    the second ideal diode includes a second diode MOSFET coupled to a second diode controller configured to control the second diode MOSFET;
    wherein the first diode controller is configured to receive a first diode input and control the first diode MOSFET based on the first diode input, the second diode controller is configured to receive a second diode input and control the second diode MOSFET based on the second diode input and the test controller is further configured to determine the operating status of the power system based on at least one of the first diode input or the second diode input,
    the first diode MOSFET is coupled to a first MOSFET input configured to control the first diode MOSFET, the second diode MOSFET is coupled to a second MOSFET input configured to control the second diode MOSFET, the first diode controller receives the first diode input from the test controller, the second diode controller receives the second diode input from the test controller, the test controller is coupled to the first MOSFET input, the test controller is coupled to the second MOSFET input, and the test controller is further configured to determine the operating status of the power system based on at least one of the first MOSFET input or the second MOSFET input.

2. The power system of claim 1, wherein the first switching circuit includes a first switch controller coupled to a first switch metal-oxide semiconductor field-effect transistor (MOSFET) and the second switching circuit includes a second switch controller coupled to a second switch MOSFET.

3. The power system of claim 2, wherein the first switching circuit is implemented using a first voltage current surge protector controller and the second switching circuit is implemented using a second voltage current surge protector controller.

4. The power system of claim 1, wherein the first diode controller is implemented using a first positive high voltage ideal diode and the second diode controller is implemented using a second positive high voltage ideal diode.

5. The power system of claim 1, wherein the first diode controller is configured to generate a first fault signal indicating whether a first MOSFET voltage across the first diode MOSFET is greater than a first predetermined voltage, the second diode controller is configured to generate a second fault signal indicating whether a second MOSFET voltage across the second diode MOSFET is greater than a second predetermined voltage and the test controller is further configured to determine the operating status of the power system based on at least one of the first fault signal or the second fault signal.

6. A method for determining an operating status of a power system having a first ideal diode coupled to a first power input and a power output and a second ideal diode coupled to a second power input and the power output, the method comprising:

controlling, by a test controller, a first switch input of a first switching circuit positioned between the first power input and the first ideal diode and configured to switch between a first switch open state that prevents a first voltage signal from being received at the first ideal diode and a first switch closed state based on the first switch input;

controlling by the test controller, a second switch input of a second switching circuit positioned between the second power input and the second ideal diode and configured to switch between a second switch open state that prevents the first voltage signal from being received at the second ideal diode and a second switch closed state based on the second switch input; and determining, by the test controller, the operating status of the power system based on the first switch input, the second switch input and the power output.

7. The method of claim 6, further comprising:

adjusting, by the test controller, the first switch input so that the first switching circuit is in an open state;

wherein determining the operating status of the power system includes determining that an open circuit exists between the second power input and the power output in response to a voltage at the power output being low.

8. The method of claim 6, further comprising:

adjusting, by the test controller, the first switch input so that the first switching circuit is in an open state, wherein determining the operating status of the power system includes determining that the second ideal diode is open in response to a status of a second fault signal indicating that a voltage across the first ideal diode is greater than a predetermined voltage.

9. The method of claim 6, further comprising:

adjusting, by the test controller, a first input to a second diode MOSFET of the second ideal diode such that an amount of current flowing through the second ideal diode is reduced, wherein determining the operating status of the power system includes determining that at least one of the second diode MOSFET or a second diode controller of the second ideal diode coupled to the second diode MOSFET is shorted in response to a second fault signal indicating that a voltage across the second ideal diode is lower than a predetermined voltage.

10. The method of claim 9, further comprising:

adjusting, by the test controller, a second input to the second diode controller of the second ideal diode, wherein determining the operating status of the power system includes determining that the second diode controller is faulty in response to the second fault signal indicating that the voltage across the second ideal diode is lower than the predetermined voltage.

11. The method of claim 10, wherein determining the operating status of the power system includes determining that the second diode MOSFET is shorted in response to the second fault signal indicating that the voltage across the second ideal diode is greater than the predetermined voltage.

12. The method of claim 6, further comprising:

adjusting, by the test controller, an input to a second diode MOSFET of the second ideal diode such that an amount of current flowing through the second ideal diode is reduced from an operating level; and adjusting, by the test controller, the input to the second diode MOSFET of the second ideal diode such that the amount of current flowing through the second ideal diode is increased to the operating level, wherein determining the operating status of the power system includes determining that a second diode controller of the second ideal diode that is coupled to the second diode MOSFET is faulty in response to a second fault signal indicating that a voltage across the second ideal diode is lower than a predetermined voltage.

* * * * *